(12) United States Patent
Hronik

(10) Patent No.: US 7,560,936 B1
(45) Date of Patent: Jul. 14, 2009

(54) METHOD AND APPARATUS FOR GROUND BOUNCE AND POWER SUPPLY BOUNCE DETECTION

(75) Inventor: Stanley Hronik, Sunnyvale, CA (US)

(73) Assignee: Integrated Device Technology, Inc., San Jose, CA (US)

( * ) Notice: Subject to any disclaimer, the term of this patent is extended or adjusted under 35 U.S.C. 154(b) by 106 days.

(21) Appl. No.: 11/739,459

(22) Filed: Apr. 24, 2007

(51) Int. Cl.
  *G01R 31/02* (2006.01)
(52) U.S. Cl. .................... 324/537; 340/657; 340/659; 361/78
(58) Field of Classification Search ............. 324/537
  See application file for complete search history.

(56) References Cited

U.S. PATENT DOCUMENTS

| | | | | |
|---|---|---|---|---|
| 5,804,995 A | * | 9/1998 | Knuth et al. | 327/74 |
| 6,380,770 B1 | * | 4/2002 | Pasqualini | 327/112 |
| 6,806,729 B2 | * | 10/2004 | Wallace et al. | 326/33 |
| 6,937,971 B1 | * | 8/2005 | Smith et al. | 703/18 |
| 6,946,846 B2 | * | 9/2005 | Corr | 324/537 |
| 7,355,435 B2 | * | 4/2008 | Ferraiolo et al. | 324/771 |
| 2002/0097067 A1 | * | 7/2002 | Wallace et al. | 326/21 |
| 2005/0212599 A1 | * | 9/2005 | Lin et al. | 330/258 |
| 2006/0197509 A1 | * | 9/2006 | Kanamori et al. | 323/222 |

* cited by examiner

*Primary Examiner*—Vincent Q Nguyen
*Assistant Examiner*—Benjamin M Baldridge
(74) *Attorney, Agent, or Firm*—Heimlich Law; Alan Heimlich, Esq.

(57) ABSTRACT

A method and apparatus for ground bounce and power supply bounce detection in devices have been disclosed. In one case one input to a differential amplifier is coupled to a reference voltage and another input to the differential amplifier is coupled to a measurement point and the output of the differential amplifier is coupled through a diode to a sample and hold circuit which is coupled to an analog to digital converter.

1 Claim, 7 Drawing Sheets

METHOD AND APPARATUS FOR GROUND BOUNCE AND POWER SUPPLY BOUNCE DETECTION

RELATED APPLICATION

This application is related to application Ser. No. 11/395,602 filed Mar. 31, 2006 titled "Method and Apparatus for Parameter Adjustment, Testing, and Configuration", which is hereby incorporated herein by reference in its entirety including all incorporated references therein.

FIELD OF THE INVENTION

The present invention pertains to voltage sensing. More particularly, the present invention relates to a method and apparatus for ground bounce and power supply bounce detection.

BACKGROUND OF THE INVENTION

As electronic devices bus widths and bus speeds increase, the components that drive those busses must accommodate the accompanying current surges through the power ($V_{DD}$) and ground ($V_{SS}$) connections of the components. The current surge flowing through the impedance in component power connections, results in a voltage oscillation between the component power or ground reference level and the "system" power or ground voltage reference level. Some common names for this voltage oscillation include "Ground Bounce", "$V_{DD}$ Bounce", and "Simultaneous Switching Noise" (SSI). These bounces may upset the circuitry and/or cause it to not operate properly. This may present a problem.

Measuring ground bounce or simultaneous switching noise on a component is done in a controlled lab bench environment. The test may be performed several ways, however it usually involves forcing one un-terminated output to a logic low state and attaching an oscilloscope between this output and the ground reference level in the system. The output should provide a low impedance path to the internal ground level (e.g. die ground in an IC (integrated circuit)), and the setup will allow an observation of any fluctuation in the voltage of the die ground relative to the system ground. While in this setup, as many other outputs as practical are forced to simultaneously switch from a logic high state to a low logic state. The fluctuation in the die voltage or "bounce" is observed on the oscilloscope. The bench environment may not represent the actual system usage of a component, resulting in false or incomplete results. This may present a problem.

Measuring $V_{DD}$ bounce is performed in a similar way, except the un-terminated output is forced to a logic high, and the remaining outputs are forced to switch from a logic low to a logic high. The bench environment may not represent the actual system usage of a component, resulting in false or incomplete results. This may present a problem.

BRIEF DESCRIPTION OF THE DRAWINGS

The invention is illustrated by way of example and not limitation in the figures of the accompanying drawings in which.

DETAILED DESCRIPTION

As used in this description, "power supply", "power", "power supply rail", "Vdd", "Vcc", "Vddq", or similar phrases means a voltage supply not at a ground potential. While Vdd may generally be considered positive with respect to a ground, the techniques disclosed herein may be used with any power supply polarity and/or multiple voltages both positive and negative. "Ground", "GND", or similar phrases is understood by one of skill in the art as a common return path for electrical currents. By convention ground is generally considered to be a zero voltage reference with respect to the circuit it is part of (e.g. signal ground, power ground, etc.). "Rail", "voltage rail", "plane", or similar phrases is understood by one of skill in the art as a source of power in a circuit. Thus a rail could be a power supply (i.e. power supply rail), or ground. "Node" or similar phrases is understood by one of skill in the art to refer to any electrical point in a device or circuit. Thus a node may be at a power supply, rail, ground, or any point in a circuit.

In one embodiment, the invention may be used for measuring ground and/or $V_{DD}$ bounce on a component in a system during operation. Using the invention, the testing may be performed during active system usage. This enables testing in a wide variety situations including system debug, system environmental testing, system configuration, and routine system monitoring. Testing may be performed under any system condition or environment that is indicative of the range of product usage. The invention allows system self-testing without the need for specialized test equipment.

At a higher system level, if the component(s) and system have been designed to utilize the present invention, then measurement, communication, and adjustments based on the measurement(s) may be made. For example, if a device (component) is reporting excessive ground bounce and output slew rate can be slowed, then ground bounce may be reduced.

In one embodiment, the invention allows testing in a system or field environment using JTAG (Joint Test Action Group) or some other communication scheme (e.g. I2C (Inter-integrated Circuit), other serial or parallel interfaces) to sense the ground bounce or Vdd bounce occurring in a component in an actual system environment. This allows the user to test for ground bounce in situations where testing was previously not possible.

In one embodiment, the invention places a bounce detection circuit on the circuit or component that is being tested. The circuit senses changes in the voltage on the internal ground or $V_{DD}$ supply levels and allows the system to read or monitor the results. An external connection to a stable reference voltage allows an accurate comparison between the internal voltage and the stable reference.

Figure 3:
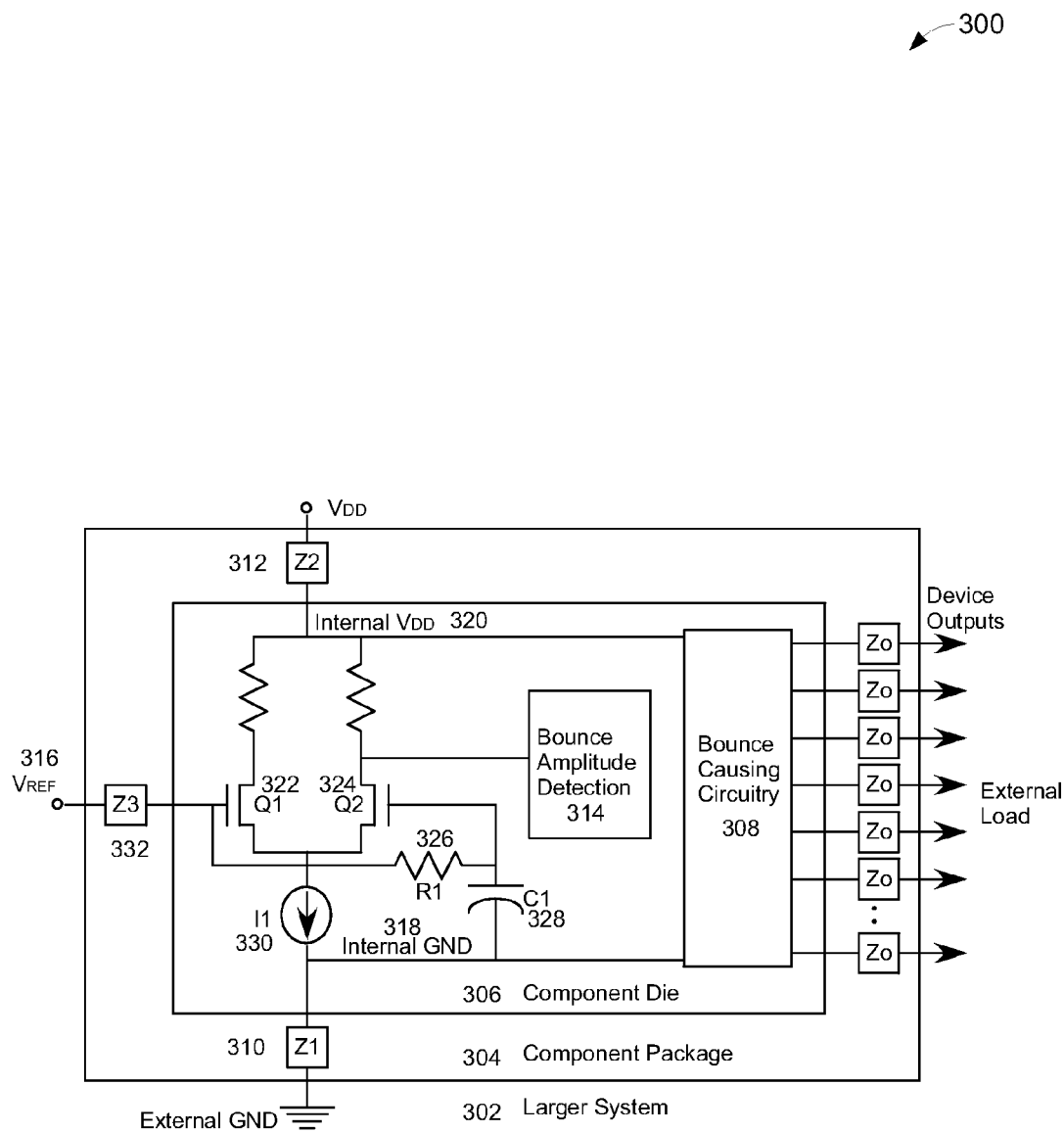
FIG. 3 illustrates one embodiment of the present invention showing a simplified model of a Ground Bounce detection circuit.

FIG. 3 illustrates, generally at 300, one embodiment of the present invention showing a simplified model of a Ground Bounce detection circuit. There are three major parts to the model. The first is the "Larger System" (302) that defines the reference location for the stable power supply. The second is the Component Package (304), which in most cases will be one of the primary causes of the bounce. The third is the Component Die (306) or in some cases an assembly in which the bounce is being tested.

An example of a system that would use the bounce detection circuit would be a component, such as a microprocessor or memory installed on a motherboard in a system. In this example, the "Larger System" (302) would be the motherboard. The "Component Package" (304) would be the device package, such as a BGA (Ball Grid Array). The "Component Die" (306) would be the silicon of the microprocessor or memory.

In FIG. 3, the "Bounce Causing Circuitry" (308) is anything within the component (306 within 304) that would cause current surges through the ground connection Z1 (310) or the power connection Z2 (312). One of the primary sources of current surges is output drivers driving an external load. Other sources of current surges include internal banks of switching circuitry that simultaneously switch, based upon a clock or other trigger event.

The "Bounce Amplitude Detection" (314) is any technique for detecting a voltage level change (several examples will be discussed later). Vref (316) is an external voltage that is used as a reference.

With reference to FIG. 3 there is a stable state condition and a bounce condition.

During operation when the Internal GND (318) and Internal $V_{DD}$ (320) are stabilizing, a balanced condition will develop:

1) The voltage Vref (316) will provide a stable voltage reference to the gate of Q1 (gate of 322).
2) The resistor R1 (326) will allow a slow charging of capacitor C1 (328) until the voltage across R1 (326) is zero and the voltage at the gate of Q2 (gate of 324) is the same as the voltage at the gate of Q1 (gate of 322). The voltage on C1 (328) will stabilize.
3) The differential amplifier (comprised of Q1, Q2, associated load resistors, and current source I1) will have a stable current flow through the current source I1 (330) and equal current will be flowing through both Q1 (322) and Q2 (324).
4) There will be no current flow from Vref (316) when the device is stable, meaning there is no voltage drop across Z3 (332).
5) The "bounce amplitude detection" circuit (314) will sense a stable voltage.

When a current surge through "Z1" (310) occurs, caused by the "Bounce Causing Circuitry" (308), the voltage on the Internal GND (318) will shift relative to the Vref reference (316) (based upon Ohm's law). This causes the following events to occur.

1) The voltage on the "Component Die" (306) relative to the "Larger System" (302) will fluctuate relative to the current flowing through Z1 (310).
2) The voltage change on the Internal GND (318) will be transferred to the gate of Q2 (gate of 324) through C1 (328), causing the voltage on the gate of Q2 (gate of 324) to fluctuate proportionately to the voltage on the Internal GND (318).
3) The voltage Vref (316) will remain stable and will provide a stable reference to the gate of Q1 (gate of 322). The impedance of R1 (326) is high compared to the impedance of Z3 (332), allowing any dynamic current flow through R1 (326) to be discounted (i.e. not a significant source of voltage change).
4) The differential amplifier (comprised of Q1, Q2, associated load resistors, and current source I1) will sense the difference between the voltage on the gates of Q1 and Q2 (gates of 322 and 324 respectively). The amplifier will
    a) Amplify the difference
    b) Adjust the offset for proper sensing by the "Bounce Amplitude Detection" circuit (314)
5) The "Bounce Amplitude Detection" circuit (314) will sense the bounce and report it.

It should be noted that the bounce affects the performance of the current source (I1 330) in the differential amplifier (comprised of Q1, Q2, associated load resistors, and current source I1). By setting the gain of the amplifier (primarily through the resistor values in the legs of the differential amplifier), the effect from the current source (I1 330) may be calibrated out.

Other embodiments for bounce amplitude measurement are possible and one of skill in the art will appreciate that there are many approaches and variations. For example, as an alternative, the differential amplifier and current source that senses the bounce may be powered by independent power connections, isolating it from the bounce on the remainder of the component. Using this approach, highly accurate bounce level detection may be achieved.

Figure 4:
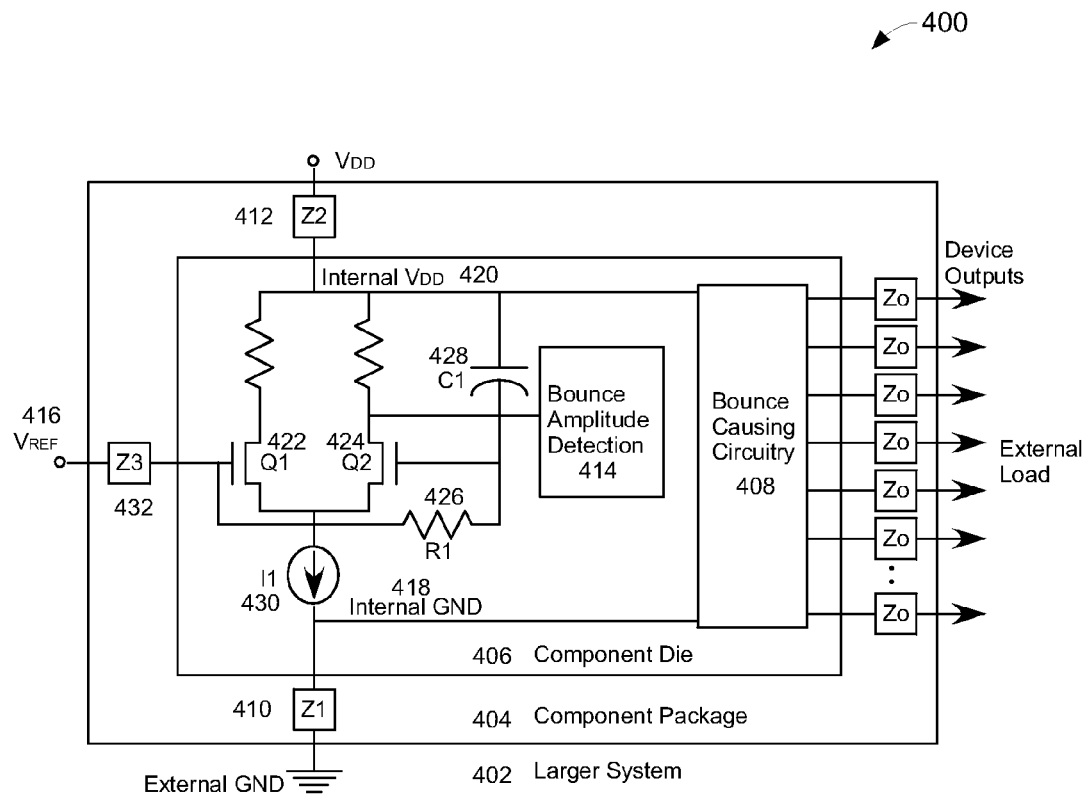
FIG. 4 illustrates one embodiment of the present invention showing a simplified model of a $V_{DD}$ Bounce detection circuit.

The invention may also be used to detect and report bounce in the internal power level (Internal $V_{DD}$) of a component. FIG. 4 illustrates, generally at 400, one embodiment of the present invention showing a simplified model of a $V_{DD}$ Bounce detection circuit. FIG. 4 is similar to FIG. 3, except the capacitor C1 (428) is connected from the gate of Q2 (gate of 424) to the Internal $V_{DD}$ (420), instead of the Internal GND (418).

There are three major parts to the model. The first is the "Larger System" (402) that defines the reference location for the stable power supply. The second is the Component Package (404), which in most cases will be one of the primary causes of the bounce. The third is the Component Die (406) or in some cases an assembly in which the bounce is being tested.

An example of a system that would use the bounce detection circuit would be a component, such as a microprocessor or memory installed on a motherboard in a system. In this example, the "Larger System" (402) would be the motherboard. The "Component Package" (404) would be the device package, such as a BGA (Ball Grid Array). The "Component Die" (406) would be the silicon of the microprocessor or memory.

Within the FIG. 4, the "Bounce Causing Circuitry" (408) is anything within the component (406 within 404) that would cause current surges through the ground connection Z1 (410) or the power connection Z2 (412). One of the primary sources of current surges is the output drivers driving an external load. Other sources of current surges include internal banks of switching circuitry that simultaneously switch, based upon a clock or other trigger event.

The "Bounce Amplitude Detection" (414) is any technique for detecting a voltage level change (several examples will be discussed later). Vref (416) is an external voltage that is used as a reference.

With reference to FIG. 4 there is a stable state condition and a bounce condition.

During operation when the Internal GND (418) and Internal $V_{DD}$ (420) are stabilizing, a balanced condition will develop:

1) The voltage Vref (416) will provide a stable voltage reference to the gate of Q1 (gate of 422).

2) The resistor R1 (426) will allow a slow discharging of capacitor C1 (428) until the voltage across R1 (426) is zero and the voltage at the gate of Q2 (gate of 424) is the same as the voltage at the gate of Q1 (gate of 422). The voltage on C1 (428) will stabilize.

3) The differential amplifier (comprised of Q1, Q2, associated load resistors, and current source I1) will have a stable current flow through the current source I1 (430) and equal current will be flowing through both Q1 (422) and Q2 (424).

4) There will be no current flow from Vref (416) when the device is stable, meaning there is no voltage drop across Z3 (432).

5) The "bounce amplitude detection" circuit (414) will sense a stable voltage.

When a current surge through "Z2" (412) occurs, caused by the "Bounce Causing Circuitry" (408), the voltage on the Internal $V_{DD}$ (420) will shift relative to the Vref reference (416) (based upon Ohm's law). This causes the following events to occur.

1) The voltage on the "Component Die" (406) relative to the "Larger System" (402) will fluctuate relative to the current flowing through Z2 (412).

2) The voltage change on the Internal $V_{DD}$ (420) will be transferred to the gate of Q2 (gate of 424) through C1 (428), causing the voltage on the gate of Q2 (gate of 424) to fluctuate proportionately to the voltage on the Internal $V_{DD}$ (418).

3) The voltage Vref (416) will remain stable and will provide a stable reference to the gate of Q1 (gate of 422). The impedance of R1 (426) is high compared to the impedance of Z3 (432), allowing any dynamic current flow through R1 (426) to be discounted (i.e. not a significant source of voltage change).

4) The differential amplifier (comprised of Q1, Q2, associated load resistors, and current source I1) will sense the difference between the voltage on the gates of Q1 and Q2 (gates of 422 and 424 respectively). The amplifier will
   a) Amplify the difference
   b) Adjust the offset for proper sensing by the "Bounce Amplitude Detection" circuit (414)

5) The "Bounce Amplitude Detection" circuit (414) will sense the bounce and report it.

It should be noted that the bounce affects the performance of the current source (I1 430) in the differential amplifier (comprised of Q1, Q2, associated load resistors, and current source I1). By setting the gain of the amplifier (primary through the resistor values in the legs of the differential amplifier), the effect from the current source (I1 430) may be calibrated out.

Other embodiments for bounce amplitude measurement are possible and one of skill in the art will appreciate that there are many approaches and variations. For example, as an alternative, the differential amplifier and current source that senses the bounce may be powered by independent power connections, isolating it from the bounce on the remainder of the component. Using this approach, highly accurate bounce level detection may be achieved.

One of skill in the art will recognize that other variations are also possible, for example, the circuits in FIG. 3 and FIG. 4 consist of a differential amplifier tied to $V_{REF}$ externally. Some interfaces may have some form of reference voltage that is externally supplied and kept as noise free as possible. If there is no low noise $V_{REF}$, the $V_{REF}$ could be any supplied, quiet voltage that is at approximately one-half the Internal $V_{DD}$.

In both FIG. 3 and FIG. 4 is a block labeled "Bounce Amplitude Detection" (314, 414 respectively). This represents any detection method the user may wish to implement to sense the bounce level. Two examples of functions this circuit may perform are as follows:

1) Establish a trip point. If the user is only interested in sensing that the bounce has exceeded a threshold, the "Bounce Amplitude Detection" may be used to toggle a switch when bounce exceeds a threshold. The state of the switch may then be reported. An example of this is shown in FIG. 5.

2) Provide a peak measurement. In this scenario, a sample and hold may be used to sense when the bounce has peaked and then an A to D conversion (analog to digital conversion) may be performed to report the information. An example of this is shown in FIG. 6.

Figure 5:
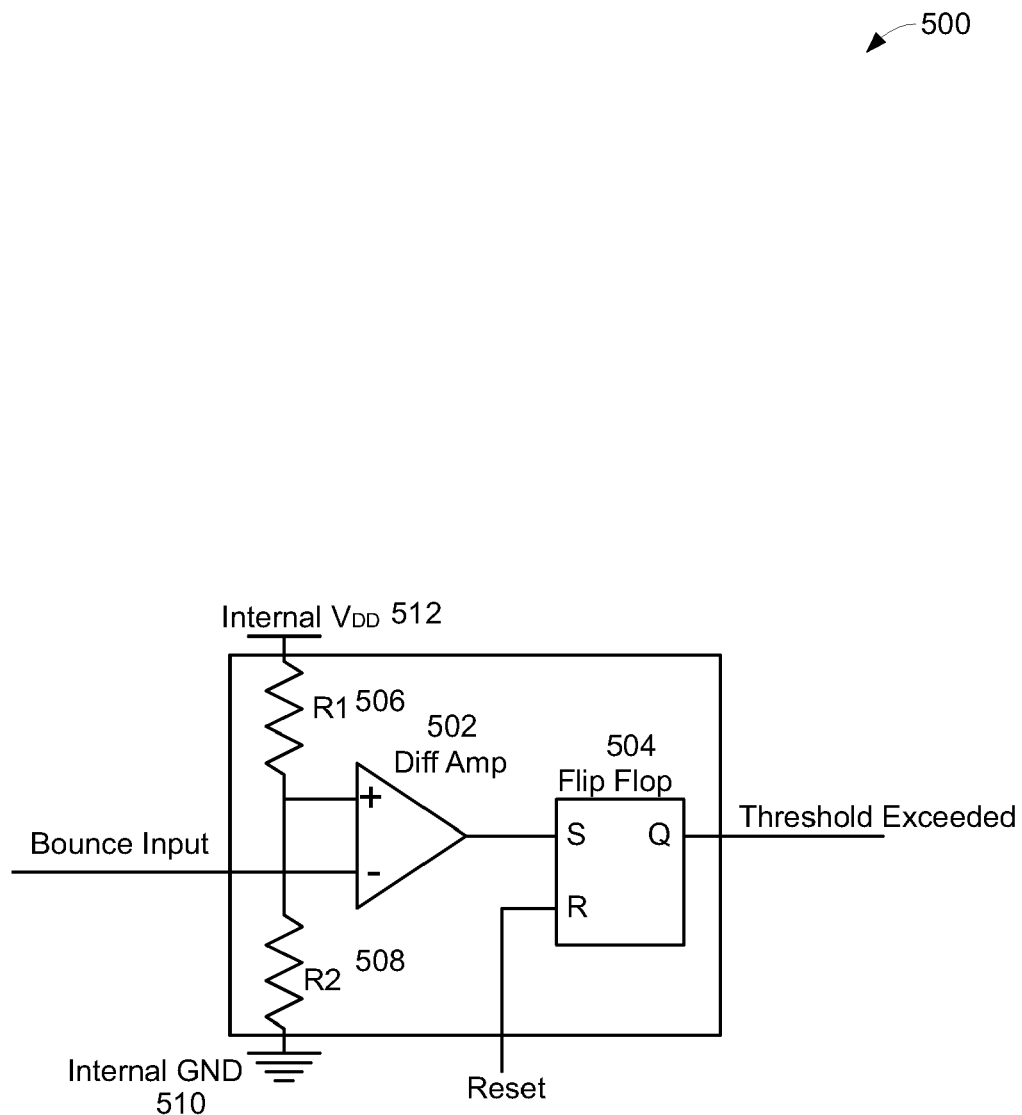
FIG. 5 illustrates one embodiment of the present invention showing a simplified model of a Bounce Amplitude Detection Circuit.

FIG. 5 illustrates, generally at 500, one embodiment of the present invention showing a simplified model of a Bounce Amplitude Detection Circuit. The Bounce Amplitude Detection may be performed by any threshold detection method. The example shown in FIG. 5 is an approach for setting a maximum threshold trip point. For example, with respect to FIG. 3, as bounce occurs in the circuit shown in FIG. 3 the voltage on the gate of Q2 will increase, causing Q2 to turn on more. This will allow more current to flow through the associated resistor and cause the voltage entering the "Bounce Amplitude Detection" circuit to drop. Entering the "Bounce Amplitude Detection Circuit" of FIG. 5, the dropping voltage will upset the Diff Amp (FIG. 5 at 502), causing the Diff Amp (502) to trigger the SR Flip Flop (504). The fact that the threshold was exceeded will be reported by the flip flop (504 at output Q) and held until the FF is reset (via R of 504). The values of R1 (506) and R2 (508) may be set to any value to establish the desired trip point.

Unless isolated from the rest of the circuit, when designing the thresholds and trip points (such as in FIG. 5), the user should be aware that the Internal GND (such as 510) and Internal $V_{DD}$ (such as 512) of the Bounce Amplitude Detection circuit will be bouncing and will affect the measurement. This effect may be calibrated out (e.g. compensating for the effect), for example, by setting the gain of the differential amplifiers of FIG. 3 and FIG. 4 and setting the trip point of FIG. 5.

Figure 6:
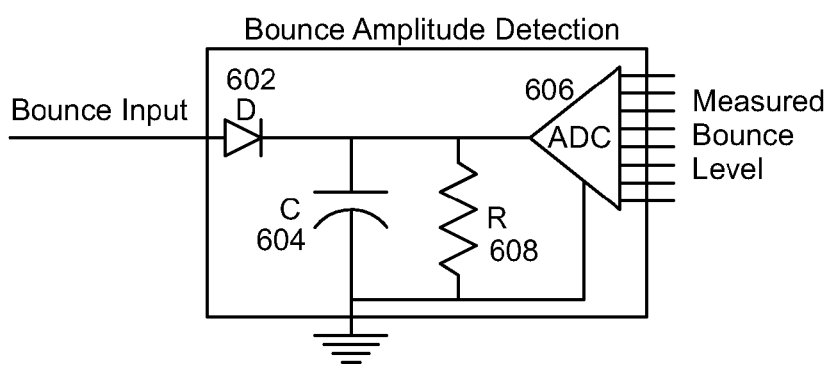
FIG. 6 illustrates one embodiment of the present invention showing Bounce Amplitude Detection for measuring the bounce amplitude.

FIG. 6 illustrates, generally at 600, one embodiment of the present invention showing Bounce Amplitude Detection for measuring the bounce amplitude. If the bounce amplitude is positive, as would be the case with a $V_{DD}$ measurement, the diode (602) would allow the voltage to enter the Bounce Amplitude Detection circuit and charge the capacitor (604). The capacitor (604) is small enough to fully charge to the peak voltage quickly and hold the charge for an extended period of time. The voltage on the capacitor (604) can then be measured by the ADC (analog to digital converter) (606) and reported. The resistor "R" (608) is used to provide leakage to the capacitor (604), so that in the event that the bounce declines, the voltage on the capacitor (604) will slowly adjust to the new level. The resistor (608) will also assist in initialization of the voltage level on C (604).

Note that the circuit in FIG. 6 is useful only with a positive going Bounce Input. To measure a negative going Bounce Input, the polarity of the diode D (such as 602) should be reversed. It will be necessary to reposition R (608) to insure that the capacitor (604) charges (possibly attach R (608) to a $V_{DD}$ source). In some applications, the connection of C (604) to an Internal $V_{DD}$ instead of an Internal GND may be preferred. Typically C (604) should be attached to the plane (VDD or GND) being tested to allow calibrating the test.

Attaching C (604) to the opposite plane may provide a "quieter" supply, however, the results may be less predictable because the amount of current surge on the opposite plane is unknown.

For the techniques disclosed above a designer will appreciate that calibration for all the techniques may be performed by comparing bench test methods with the integrated test method of the invention. In this way adjustment of values may be made to achieve even better performance.

One of skill in the art will appreciate that other combinations of the techniques disclosed may be combined to achieve added capability or functionality. For example a switch may be implemented (e.g. switch transistor, transmission gate, etc.) such that the capacitor, such as C1 in FIG. 3 and FIG. 4 may be switched to either Internal GND as in FIG. 3 to measure ground bounce or to Internal Vdd as in FIG. 4 to measure Vdd bounce. This switching may be under program control, from for example, a JTAG source. In this way, measurements of several "bounce" sources may be made.

Additionally, under dynamic control (via JTAG for example) a bounce amplitude detection circuit such as that in FIG. 5 may be adjusted by varying R1 (506) and R2 (508) under program control. In this way a "sweep" may be made to trip or trigger on the bounce and provide a more accurate indication of the amplitude.

One of skill in the art will appreciate that by comparing a bench bounce measurement with the internal measurement (such as by adjusting R1 and R2 in FIG. 5) a much closer correlation may be achieved. Given the availability of non-volatile memory and adjustable elements, such as tunable resistors, a die component may be configured at power up with values to correct or compensate for device non-linearities. Additionally, such compensation may be in real time and based on high level system wide or even local optimization routines. In this way bounce may be "adjusted" as needed to achieve better performance, lower power, lower noise, wider operating margins, and/or higher speed operation.

Adjusting bounce may be possible depending upon the circuitry involved, for example, switching noise resulting in bounce may be caused by multiple bits switching in tandem. Thus one approach may be to alter the slew rate or limit the slew rate of the bits switching, or by varying the number of bits switching, staggering (in time) the switching, etc.

Detecting the amount of actual noise caused by the switching and reporting this information, for example via a serial data chain, may be used to identify switching conditions, which may cause device upset or poor output signal quality, etc. Knowing the amount of switching noise may give insight into operation, operating margins, failure causes or conditions at the chip, device, component, and/or system level. One of skill in the art will appreciate that a variety of approaches may be used to set up and/or retrieve report measurements of bounce. For example, JTAG may be used.

Figure 7:
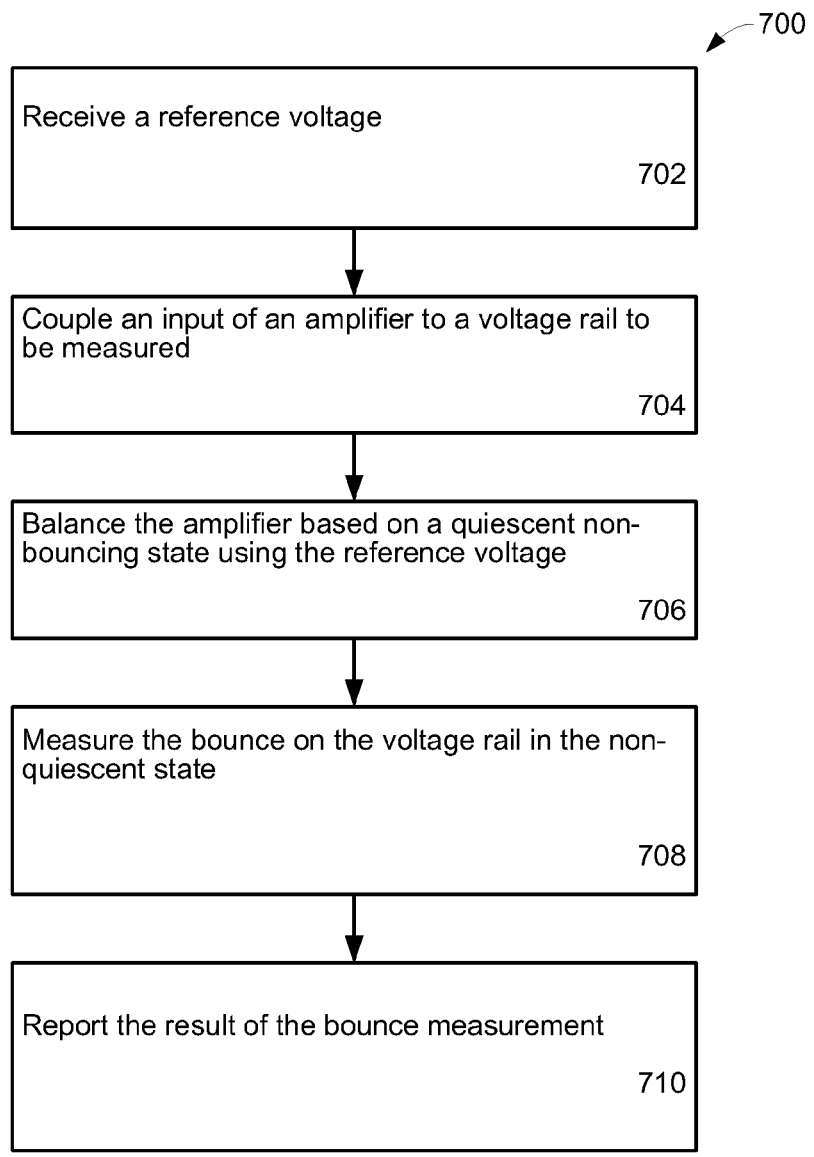
FIG. 7 illustrates one embodiment of the invention in flow chart form.

FIG. 7 illustrates, generally at 700, one embodiment of the invention in flow chart form. At 702 a reference voltage is received. At 704 an input to an amplifier is coupled to a voltage rail to be measured. At 706 the amplifier is balanced using the reference voltage when a quiescent non-bouncing state is present. At 708 a measurement of the bounce on the voltage rail is made during the non-quiescent state. At 710 the results of the bounce measurement are reported.

Thus a method and apparatus for ground bounce and power supply bounce detection have been described.

Figure 1:
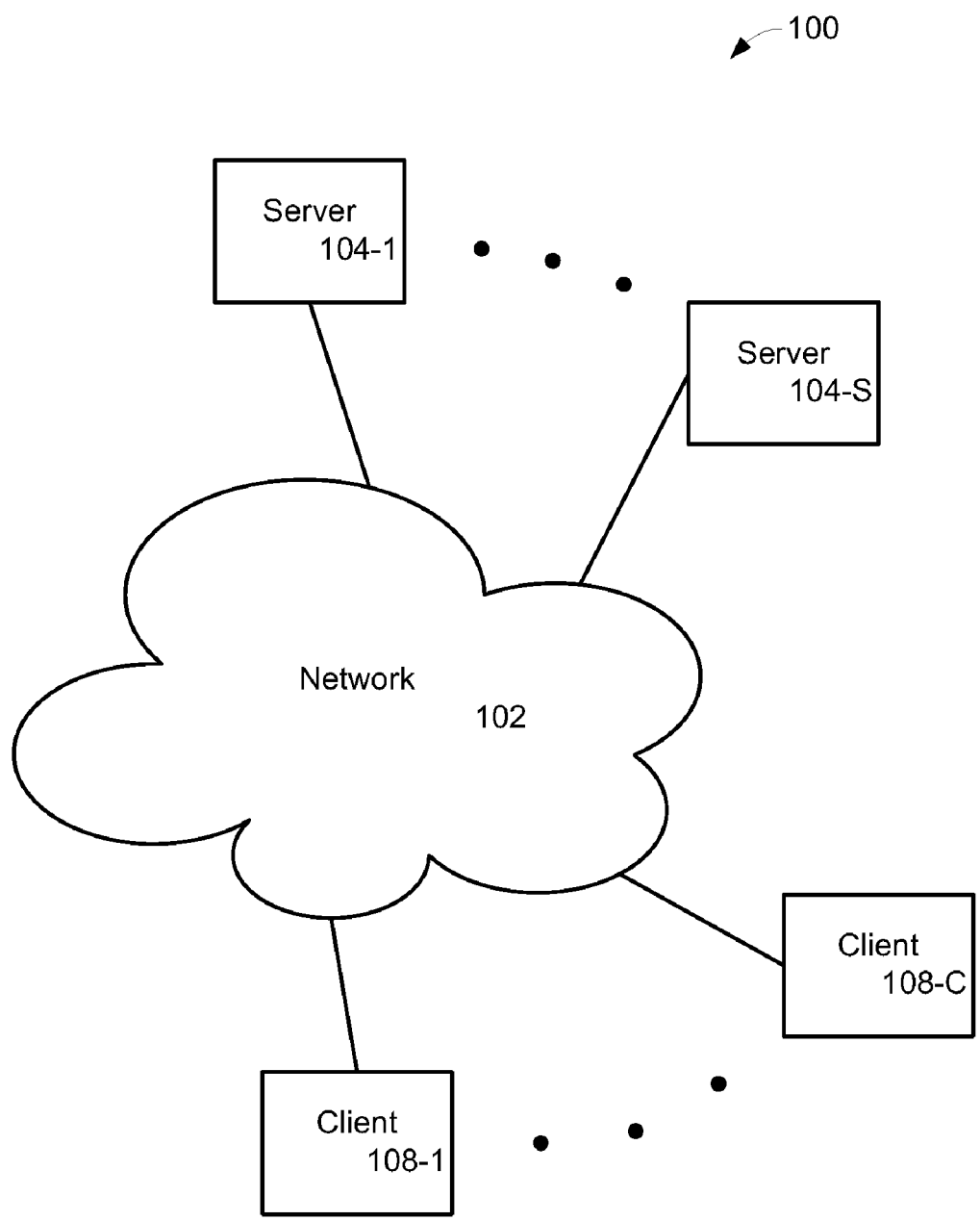
FIG. 1 illustrates a network environment in which the method and apparatus of the invention may be implemented.

FIG. 1 illustrates a network environment 100 in which the techniques described may be applied. The network environment 100 has a network 102 that connects S servers 104-1 through 104-S, and C clients 108-1 through 108-C. More details are described below.

Figure 2:
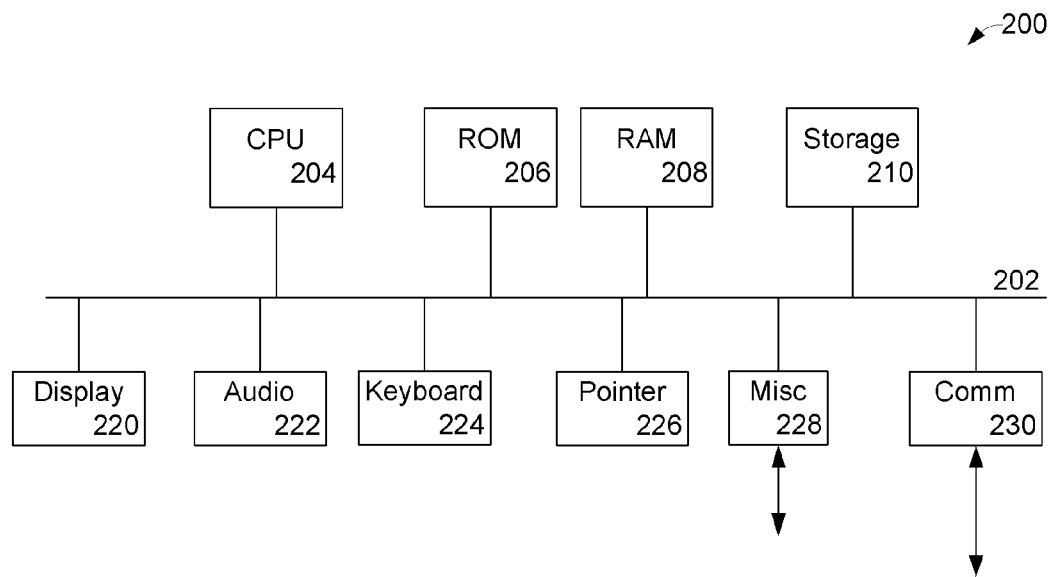
FIG. 2 is a block diagram of a computer system in which some embodiments of the invention may be used.

FIG. 2 is a block diagram of a computer system 200 in which some embodiments of the invention may be used and which may be representative of use in any of the clients and/or servers shown in FIG. 1, as well as, devices, clients, and servers in other Figures. More details are described below.

Referring back to FIG. 1, FIG. 1 illustrates a network environment 100 in which the techniques described may be applied. The network environment 100 has a network 102 that connects S servers 104-1 through 104-S, and C clients 108-1 through 108-C. As shown, several computer systems in the form of S servers 104-1 through 104-S and C clients 108-1 through 108-C are connected to each other via a network 102, which may be, for example, a corporate based network. Note that alternatively the network 102 might be or include one or more of: the Internet, a Local Area Network (LAN), Wide Area Network (WAN), satellite link, fiber network, cable network, or a combination of these and/or others. The servers may represent, for example, disk storage systems alone or storage and computing resources. Likewise, the clients may have computing, storage, and viewing capabilities. The method and apparatus described herein may be applied to any type of electronic device. Thus, for example, the invention may find application at both the S servers 104-1 through 104-S, and C clients 108-1 through 108-C.

Further the method and apparatus described herein may be available and/or capabilities based on a variety of criteria. For example, certain features may be based upon communication of a payment and/or credit.

Referring back to FIG. 2, FIG. 2 illustrates a computer system 200 in block diagram form, which may be representative of any of the clients and/or servers shown in FIG. 1. The block diagram is a high level conceptual representation and may be implemented in a variety of ways and by various architectures. Bus system 202 interconnects a Central Processing Unit (CPU) 204, Read Only Memory (ROM) 206, Random Access Memory (RAM) 208, storage 210, display 220, audio, 222, keyboard 224, pointer 226, miscellaneous input/output (I/O) devices 228, and communications 230. The bus system 202 may be for example, one or more of such buses as a system bus, Peripheral Component Interconnect (PCI), Advanced Graphics Port (AGP), Small Computer System Interface (SCSI), Institute of Electrical and Electronics Engineers (IEEE) standard number 1394 (FireWire), Universal Serial Bus (USB), etc. The CPU 204 may be a single, multiple, or even a distributed computing resource. Storage 210, may be Compact Disc (CD), Digital Versatile Disk (DVD), hard disks (HD), optical disks, tape, flash, memory sticks, video recorders, etc. Display 220 might be, for example, an embodiment of the present invention. Note that depending upon the actual implementation of a computer system, the computer system may include some, all, more, or a rearrangement of components in the block diagram. For example, a thin client might consist of a wireless hand held device that lacks, for example, a traditional keyboard. Thus, many variations on the system of FIG. 2 are possible.

For purposes of discussing and understanding the invention, it is to be understood that various terms are used by those of skill in the art to describe techniques and approaches. Furthermore, in the description, for purposes of explanation, numerous specific details are set forth in order to provide a thorough understanding of the present invention. It will be evident, however, to one of skill in the art that the present invention may be practiced without these specific details. In some instances, well-known structures and devices are shown in block diagram form, rather than in detail, in order to avoid obscuring the present invention. These embodiments are described in sufficient detail to enable those of skill in the art to practice the invention, and it is to be understood that other embodiments may be utilized and that logical, mechanical, electrical, and other changes may be made without departing from the scope of the present invention.

Some portions of the description may be presented in terms of algorithms and symbolic representations of operations on, for example, data bits within a computer memory, and/or logic circuitry. These algorithmic descriptions and representations are the means used by those of skill in the arts to most effectively convey the substance of their work to others of skill in the art. An algorithm is here, and generally, conceived to be a self-consistent sequence of acts leading to a desired result. The acts are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the discussion, it is appreciated that throughout the description, discussions utilizing terms such as "processing" or "computing" or "calculating" or "determining" or "displaying" or the like, can refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission, or display devices.

Further, any of the methods according to the present invention can be implemented in hard-wired circuitry, by programmable logic, or by any combination of hardware and software.

An apparatus for performing the operations herein can implement the present invention. This apparatus may be specially constructed for the required purposes, or it may comprise a general-purpose computer, selectively activated or reconfigured by a computer program stored in the computer. Such a computer program may be stored in a computer readable storage medium, such as, but not limited to, any type of disk including floppy disks, hard disks, optical disks, compact disk-read only memories (CD-ROMs), and magnetic-optical disks, read-only memories (ROMs), random access memories (RAMs), electrically programmable read-only memories (EPROM)s, electrically erasable programmable read-only memories (EEPROMs), FLASH memories, magnetic or optical cards, etc., or any type of media suitable for storing electronic instructions either local to the computer or remote to the computer.

The algorithms and displays presented herein are not inherently related to any particular computer or other apparatus. Various general-purpose systems may be used with programs in accordance with the teachings herein, or it may prove convenient to construct more specialized apparatus to perform the required method. For example, any of the methods according to the present invention can be implemented in hard-wired circuitry, by programming a general-purpose processor, or by any combination of hardware and software. One of ordinary skill in the art will immediately appreciate that the invention can be practiced with computer system configurations other than those described, including hand-held devices, multiprocessor systems, microprocessor-based or programmable consumer electronics, digital signal processing (DSP) devices, set top boxes, network PCs, minicomputers, mainframe computers, and the like. The invention can also be practiced in distributed computing environments where tasks are performed by remote processing devices that are linked through a communications network.

The methods of the invention may be implemented using computer software. If written in a programming language conforming to a recognized standard, sequences of instructions designed to implement the methods can be compiled for execution on a variety of hardware platforms and for interface to a variety of operating systems. In addition, the present invention is not described with reference to any particular programming language. It will be appreciated that a variety of programming languages may be used to implement the teachings of the invention as described herein. Furthermore, it is common in the art to speak of software, in one form or another (e.g., program, procedure, application, driver, . . . ), as taking an action or causing a result. Such expressions are merely a shorthand way of saying that execution of the software by a computer causes the processor of the computer to perform an action or produce a result.

It is to be understood that various terms and techniques are used by those knowledgeable in the art to describe communications, protocols, applications, implementations, mechanisms, etc. One such technique is the description of an implementation of a technique in terms of an algorithm or mathematical expression. That is, while the technique may be, for example, implemented as executing code on a computer, the expression of that technique may be more aptly and succinctly conveyed and communicated as a formula, algorithm, or mathematical expression. Thus, one of skill in the art would recognize a block denoting A+B=C as an additive function whose implementation in hardware and/or software would take two inputs (A and B) and produce a summation output (C). Thus, the use of formula, algorithm, or mathematical expression as descriptions is to be understood as having a physical embodiment in at least hardware and/or software (such as a computer system in which the techniques of the present invention may be practiced as well as implemented as an embodiment).

A machine-readable medium is understood to include any mechanism for storing or transmitting information in a form readable by a machine (e.g., a computer). For example, a machine-readable medium includes read only memory (ROM); random access memory (RAM); magnetic disk storage media; optical storage media; flash memory devices; electrical, optical, acoustical or other form of propagated signals (e.g., carrier waves, infrared signals, digital signals, etc.) capable of affecting a physical entity (e.g. movement) upon absorption and/or reflection of such; etc.

Embodiments of the present invention produce a useful, concrete, and tangible result, for example, but not limited to, a physical transformation in a device, a memory, or storage device, a real world display of results to a user, etc. For example, one or more embodiments of the present invention alter the contents of a device which may be in the form of a physical electrical charge on the device resulting from the tangible number of electrons and the contents of the device may be presented to a user in a real world display, such as, but not limited to, a screen, etc.

As used in this description, "one embodiment" or "an embodiment" or similar phrases means that the feature(s) being described are included in at least one embodiment of the invention. References to "one embodiment" in this description do not necessarily refer to the same embodiment; however, neither are such embodiments mutually exclusive. Nor does "one embodiment" imply that there is but a single embodiment of the invention. For example, a feature, structure, act, etc. described in "one embodiment" may also be included in other embodiments. Thus, the invention may include a variety of combinations and/or integrations of the embodiments described herein.

Thus a method and apparatus for ground bounce and power supply bounce detection have been described.

What is claimed is:

1. An apparatus comprising:
an amplifier having a first input, a second input, and an output;
an input capable of receiving a reference voltage, said received reference voltage coupled to said amplifier first input, said received reference voltage coupled through a resistor to said amplifier second input;
a capacitor having an input and an output, said capacitor output coupled to said amplifier second input, and said capacitor input coupled to a measurement point; and
a bounce detection circuit having an input, said input coupled to said amplifier output, and wherein said bounce detection circuit comprises a sample and hold circuit having an input and an output, said input coupled to said amplifier output through a diode; and an analog to digital converter having an analog input and one or more digital outputs, said analog input coupled to said sample and hold output, said one or more digital outputs capable of communicating results of an analog to digital conversion.

* * * * *